United States Patent [19]

Matsuno

[11] Patent Number: 5,592,080
[45] Date of Patent: Jan. 7, 1997

[54] RECORD MEDIUM CHECKING DEVICE INCLUDING A CIRCUIT FOR RECORDING A SIGNAL ON A RECORD MEDIUM FROM DETECTED CLOCK PULSES AND FOR SELECTIVE FREQUENCY SETTING

[75] Inventor: Tohru Matsuno, Chofu, Japan

[73] Assignee: Otari Inc., Chofu, Japan

[21] Appl. No.: 175,639

[22] Filed: Dec. 30, 1993

[30] Foreign Application Priority Data

Jan. 29, 1993 [JP] Japan .................................. 5-049831

[51] Int. Cl.⁶ .......................... G01R 33/12; G11B 27/36
[52] U.S. Cl. .............................................. 324/212; 360/31
[58] Field of Search .................................. 324/210, 211,
324/212; 360/31; 346/33 R; 365/201; 364/481;
369/53, 58; 371/10.1; 327/104

[56] References Cited

U.S. PATENT DOCUMENTS

| | | | |
|---|---|---|---|
| 3,071,723 | 1/1963 | Gabor | 324/212 |
| 4,754,222 | 6/1988 | Felleisen et al. | 324/212 |
| 4,929,894 | 5/1990 | Monett | 324/212 |
| 5,087,884 | 2/1992 | Brannon | 324/212 |
| 5,089,757 | 2/1992 | Wilson | 318/560 |
| 5,247,254 | 9/1993 | Huber et al. | 324/212 |

FOREIGN PATENT DOCUMENTS

| | | | |
|---|---|---|---|
| 7190273 | 11/1982 | Japan | 324/212 |
| 1201173 | 5/1986 | Japan | 324/212 |

OTHER PUBLICATIONS

IBM Technical Disclosure Bulletin, vol. 14, No. 9, Feb. 1972. pp. 2637–2638.

*Primary Examiner*—Sandra L. O'Shea
*Assistant Examiner*—Roger Phillips
*Attorney, Agent, or Firm*—David O'Reilly

[57] ABSTRACT

In a record medium checking device, a signal recorded on record medium is reproduced, then the absence of reproduced signal is detected. The device includes a reproducing means for reproducing the signal recorded on the record medium to output the reproduced signal, a discriminating means for comparing the reproduced signal with a reference signal to output a discriminating signal, a signal generating means for generating detecting clock pulses, and a counter to count the detecting clock pulses. The output of the counter is a check signal based on the discriminating signal.

3 Claims, 2 Drawing Sheets

RECORD MEDIUM CHECKING DEVICE INCLUDING A CIRCUIT FOR RECORDING A SIGNAL ON A RECORD MEDIUM FROM DETECTED CLOCK PULSES AND FOR SELECTIVE FREQUENCY SETTING

BACKGROUND OF THE INVENTION

1. Field of the Invention

The present invention relates to a record medium checking device for detecting the existence of defects such as dropout, pinhole or the like generated on recording mediums such as magnetic tape, magnetic discs or the like.

2. Background Information

In the prior art, a dropout, a pinhole and the like on recording mediums are detected by a method comprising the steps of recording a signal on the recording medium, and comparing the level of the reproduced signal recorded on the recording medium with that of a predetermined reference signal.

A device for carrying out the above described detection is comprised of a signal generating means for generating a signal to be recorded on a recording medium; recording means for recording the signal on a recording medium; reproducing means for reproducing the recorded signal; and an AGC circuit for controlling the level of the reproduced signal to an average level and for outputting the level control signal. The device also includes full-wave rectifying means for full-wave rectifying the level control signal; a peak detecting circuit having the drooping time constant for detecting a peak of the full-wave rectified signal; and discriminating signal output means for outputting a discriminating signal when the output from the peak detection circuit is lower than a threshold level.

In the above described device, when there is a dropout on a recording medium, attenuation of the output signal form the peak detecting circuit between a first peak and second peak, which depends on the drooping time constant, continues so that the level of the output signal is lower than a threshold level. Thus the device detects the dropout.

Further, Japanese Patent Publication No. 49310/1988 (Showa 63) discloses a dropout detection device in which pulses synchronized with zero crossing points of the signal reproduced from a recording medium are generated and includes a detector circuit comprised of an one shot multivibrator. If the pulses are constantly generated, the detector circuit keeps its output at a high level. On the other hand if the pulse train is interrupted because of a dropout, the output of the detector circuit changes to a low level, thus the dropout is detected.

When signals with low frequencies are recorded on recording mediums for inspection, the above devices can operate without a problem. However, when signals with very high frequencies, for example, signals of about several MHz are recorded on recording mediums for inspection, stable operation of the devices is difficult, because a full-wave rectifying circuit, a peak detecting circuit having the drooping time constant, and a multivibrator must be used.

Further, when the frequency of the signal to be recorded is changed according to the transport speed of a recording medium, alteration of specifications etc., the time constant of the peak detecting circuit or one shot multivibrator must be modified, therefore the circuits of the device for the modification of time constants are bulky.

SUMMARY OF INVENTION

Accordingly, it is an object of the present invention to provide a recording medium detecting device which can stably operate even if frequencies of a signal to be recorded are very high.

It is another object to provide a record medium detecting device which does not need to change the circuit parameters such as the time constant of the circuit, even if the frequency of the signal to be recorded is changed.

To achieve the above objects, a record medium checking device according to the present invention, reproduces a signal recorded on a record medium and detects an absence of the reproduced signal to check the record medium. The device comprises reproducing means for reproducing the signal recorded on the record medium to output the reproduced signal, discriminating means for comparing the reproduced signal with a predetermined reference signal to output a discriminating signal, signal generating means for generating detecting clock pulses, and counting means for counting the detecting clock pulses to output a check signal based on the discriminating signal.

The discriminating means may comprise output signal producing means for producing an inverted output and non-inverted output of the reproduced signal, a pair of comparator means for comparing the outputs from the output signal producing means with the predetermined reference signal, respectively, to output the results of the comparison, and discriminating signal output means for outputting at least one of the results of the comparison as a discriminating signal.

The detecting clock pulses may be generated with a cycle n (wherein n>0) times long as the reproduced signal.

The record medium detecting device according to the present invention operates as follows.

The reproducing means outputs the reproduced signal recorded on a record medium. When the level of the reproduced signal is higher than a reference signal level, the discriminating signal is output from the discriminating means. The signal generating means generates detecting clock pulses. The number of the detecting clock pulses are counted until the counting means is reset by the discriminating signal. When the clock pulse count number reaches a predetermined amount, the counting means outputs the detection signal to show that a defect of the reproduced signal exists.

The discriminating means operates as follows.

The producing means outputs an inverted output signal and non-inverted output signal from the reproduced signal of the reproducing means. Two comparator means compare the outputs from the producing means with the predetermined reference signal, respectively and output results of the comparison. The discriminating signal output means then outputs at least one of the results of the comparison as a discriminating signal.

Therefore, even if a high frequency signal is used, a stable check can be achieved, because the dropout etc. are detected by comparing the reproduced signal with the reference signal to generate the discriminating signal, and the detecting clock pulses count based on the discriminating signal.

Further, the high frequency signal can be used to provide a check at a more stable state because the inverted output and non-inverted output of reproduced signal are formed without full-wave rectification and the inverted output and non-inverted output of the reproduced signal are compared with the reference signal, respectively.

Further, the frequency ratio of the reproduced signal and detecting clock pulse is always kept constant because the detecting clock pulse is formed from the signal which is actually recorded, and therefore any reproduced signal with any frequencies can be checked under the same condition. Accordingly, even if the transporting speed of the record medium or the frequency of the signal to be recorded is altered, modification of the circuit parameters is not needed.

Other objects and advantages of the invention will become more apparent from the following portion of this specification and from the accompanying drawings.

DESCRIPTION OF THE PREFERRED EMBODIMENTS

Figure 1:
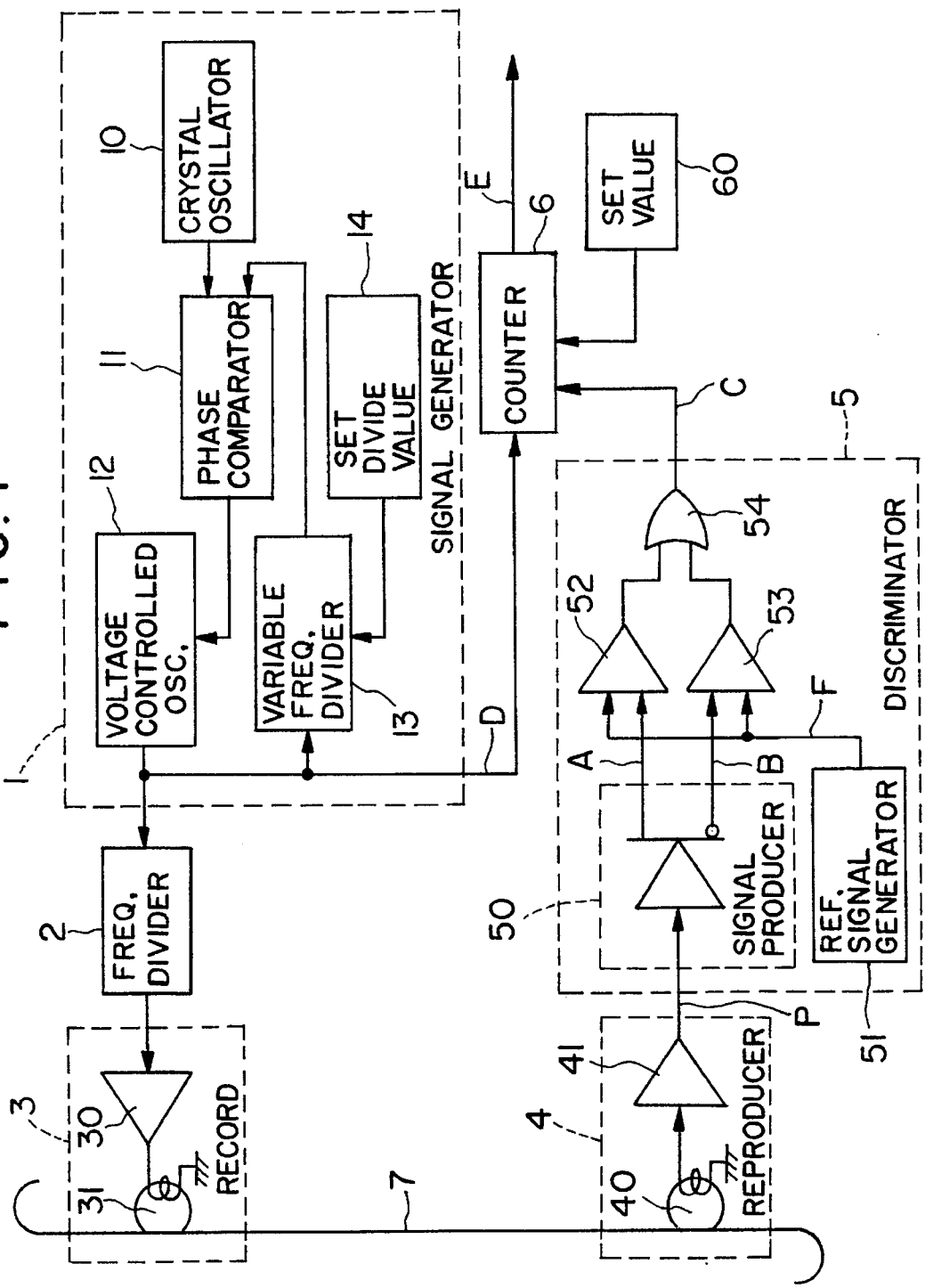
FIG. 1 is a block diagram of an embodiment of a record medium checking device according to the present invention.

Referring to the block diagram of FIG. 1, an embodiment of a record medium checking device according to the present invention, is explained.

A record medium checking device is comprised of signal generating means 1, frequency divider 2, recording means 3, reproducing means 4, discriminating means 5, and counting means 6. The record medium checking device detects the existence of dropout in magnetic tape 7, which is one of the record mediums.

Signal generating circuit 1 is a PLL circuit (phase-locked loop circuit) composed of crystal oscillator 10, phase comparator 11, voltage controlled oscillator 12, variable frequency divider 13, and dividing value setting circuit 14. Detecting clock pulse D with a desired frequency is output from signal generating circuit 1 according to the dividing value set in variable frequency divider 13 by means of dividing value setting circuit 14.

Frequency divider 2 is connected to signal generating circuit 1. A signal to be recorded is generated in frequency divider 2 by dividing detecting clock pulse D output from signal generating circuit 1. In this embodiment detecting clock pulse D is divided by four in frequency divider 2.

Recording means 3 connected with frequency divider 2 is comprised of recording amplifier 30 and recording head 31, to record the signal from frequency divider 2 on record medium 7. Reproducing circuit 4 is comprised of reproducing head 40 and reproducing amplifier 41, to reproduce the signal recorded by recording means 3 and output reproduced signal P.

Discriminating means 5 is connected to reproducing means 4. Discriminating means 5 is comprised of AGC circuit (automatic gain control circuit) 50, reference signal generating means 51, comparator 52, 53, and OR gate 54. AGC circuit 50 serving as producing means, controls the level of reproduced signal P to an average level and outputs non-inverted output signal A and inverted output signal B relative to reproduced signal P. Reference signal generating means 51 output reference signal F which is the criterion to detect the existence of dropout in the record medium. First and second comparators 52, 53 compare non-inverted output signal A and inverted output signal B from AGC circuit 50 with reference signal F, respectively. Discriminating means 5 compares reproduced signal P with reference signal F, and outputs discriminating signal C according to the result of the comparison.

Counting means 6 is a down counter connected with signal generating means 1 and discriminating means 5. Counting means 6 counts the number of detecting clock pulses D, and is reset by discriminating signal C output from discriminating means 5. When the number of detecting clock pulses D counted reaches a set value, it indicates that dropout exists and check signal E is output from counting means 6. The set value in counting means 6 is set by set value setting means 60. In this embodiment, the set value is "3".

Figure 2:
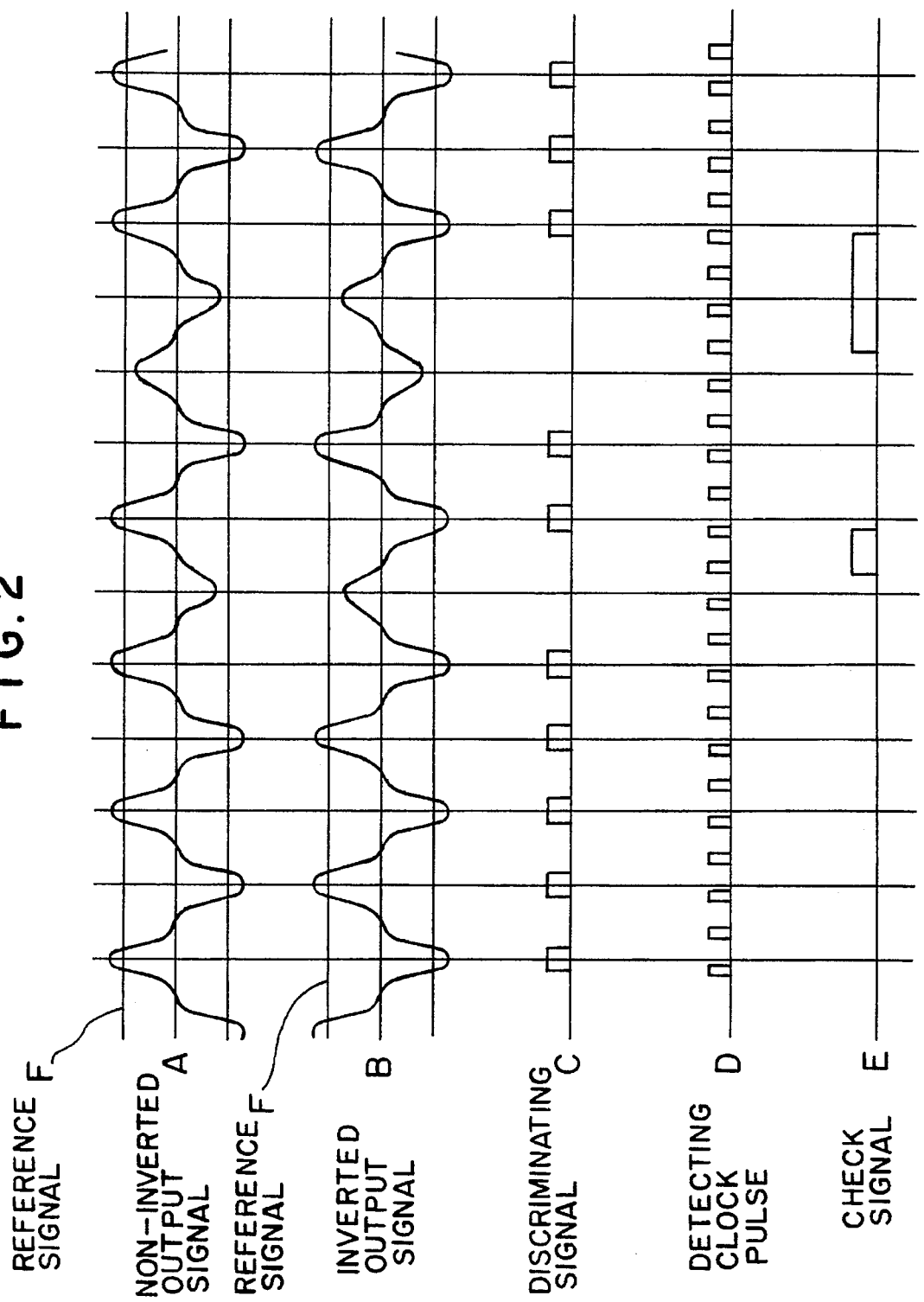
FIG. 2 is a timing chart to explain the operation of the device of FIG. 1.

With reference to FIGS. 1 and 2, the operation of the above record medium checking device is explained. FIG. 2 is a timing chart to explain the operation of the device of FIG. 1.

Signal generating means 1 generates detecting clock pulses D. Frequency divider 2 then divides the frequency of detecting clock pulses D by four. The output signal from frequency divider 2 is recorded on record medium 7 by recording means 3. Reproducing means 4 then reproduces the signal recorded on record medium 7 and outputs reproduced signal P.

The level of reproduced signal P is controlled to an average level by AGC circuit 50, and non-inverted output signal A and inverted output signal B shown in FIG. 2 are output from AGC circuit 50 to first and second comparators 52, 53. The signal recorded on a portion of the medium where dropout exists cannot be averaged because the level of the reproduced signal has been sharply lowered.

Then, non-inverted output signal A and inverted output signal B are compared with the same reference signal F, respectively, and when the level of non-inverted signal A or the level of inverted output signal B are higher than reference signal F, the higher-level signal is output from first or second comparator 52, 53. Because both non-inverted output signal A and inverted output signal B of reproduces signal F are used to compare with reference signal F, positive and negative comparisons can be performed without full-wave rectification.

When at least one of the signals from first and second comparators 52, 53 is at the higher-level, OR gate 54 outputs discriminating signal C.

Counting means 6 counts the number of detecting clock pulses D. When the signal is normally recorded on record medium 7, counting means 6 is reset by discriminating signal C before it counts three detecting clock pulses D. Therefore, unless three detecting clock pulses are received, no check signal is output from counting means 6. On the other hand, when a dropout is generated, counting means 6 is not reset by discriminating signal C until it counts three detecting clock pulses D. Therefore, counting means 6 outputs check signal E and the dropout can be detected.

The record medium checking device according to the present invention is not restricted to the above-mentioned embodiment. Various alternatives are possible within the scope of the present invention.

For example, in the above embodiment, detecting clock pulse D is generated from the signal for recording on record medium 7. However, detecting clock pulse D may be generated from reproduced signal P. In this case, when dropout exists, detecting clock pulse D cannot be generated from reproduced signal P. However, when reproduced signal P is intermittent for a certain time, clock pulses having the same period as that of detecting clock pulses D which were generated before the intermission may be used as detecting clock pulse D.

Further, in the above embodiment, the dropout can be detected every half-wave by setting the period of detecting clock pulse D to one-fourth of that of the recorded signal and setting the set value in counting means 6 to "3". However, the length of dropout to be detected can be changed by changing the frequency ratio of detecting clock pulse D with reproduced signal P or changing the set value in counting means 6.

For example, a dropout with a desired length can be detected by changing number of waves to be counted by changing the set value in counting means 6 but with the frequency ratio of detecting clock pulse D and reproduced signal P being the same as the above embodiment. Otherwise leveling down over two waves can be determined as a dropout by setting the period of detecting clock pulse to two times the period of reproduced signal P and setting the set value in counting means 6 to "2".

Further, when connecting frequency divider 2, dividing value setting means 14 and set value setting means 60 with a CPU, the dividing value and set value can be set without changing hardware. Of course, when the dividing value and set value do not need to be changed, dividing value setting means 14 and set value setting means 60 may be eliminated.

Further, if a more rough efficiency of detecting is allowed, the record medium checking device can be constructed so that only non-inverted output signal A is compared with reference signal F. Further, if the signal to be recorded and detecting clock pulse D are not altered, signal generating means 1 may be composed of only an oscillator.

What is claimed is:

1. A record medium checking device for detecting an absence of a reproduced signal on the record medium comprising:

detecting clock pulse generating means for generating detecting clock pulses, said detecting clock pulse generating means including frequency setting means for selectively setting the frequency of the detecting clock pulses;

recording means for recording a signal on the record medium from the detecting clock pulses generated by said detecting clock pulse generating means, the frequency of said recorded signal being n times the number of detecting clock pulses generated where n>o;

reproducing means for reproducing the signal recorded on the record medium;

discriminating means for producing a discriminating signal output from a comparison of the reproduced signal with a reference signal;

counting means for counting said detecting clock pulses receiving said discriminating signal input from said discriminating means and producing an output check signal at a set value if not reset by said discriminating signal;

whereby an absence of said reproduced signal from said record medium is detected and indicated by said check signal.

2. The record medium checking device according to claim 1, including dividing means connected between said detecting clock pulse generating means and said recording means;

said dividing means dividing said detecting clock pulses recorded on said record medium by a predetermined amount.

3. The recording medium checking device according to claim 1, in which said discriminating means comprise; signal producing means for reproduced an inverted and non-inverted output of said reproducing signal; a pair of comparator means for comparing said inverted and non-inverted signals from said signal producing means with a predetermined reference signal respectively and producing an output signal from said pair of comparison means; discriminating signal output means for producing discriminating signal output from one of the output signals from said pair of comparators.

* * * * *